(12) United States Patent
Blemel et al.

(10) Patent No.: US 9,816,877 B2
(45) Date of Patent: Nov. 14, 2017

(54) METHOD, SYSTEM, AND APPARATUS TO PREVENT ARC FAULTS IN ELECTRICAL CONNECTIVITY

(71) Applicants: Kenneth Gerald Blemel, Albuquerque, NM (US); Kenneth Dominic Blemel, Albuquerque, NM (US); Peter Andrew Blemel, Albuquerque, NM (US); Todd Francis Peterson, Albuquerque, NM (US)

(72) Inventors: Kenneth Gerald Blemel, Albuquerque, NM (US); Kenneth Dominic Blemel, Albuquerque, NM (US); Peter Andrew Blemel, Albuquerque, NM (US); Todd Francis Peterson, Albuquerque, NM (US)

(*) Notice: Subject to any disclaimer, the term of this patent is extended or adjusted under 35 U.S.C. 154(b) by 0 days.

(21) Appl. No.: 14/756,720

(22) Filed: Oct. 5, 2015

(65) Prior Publication Data

US 2016/0097685 A1   Apr. 7, 2016

Related U.S. Application Data

(60) Provisional application No. 62/071,789, filed on Oct. 3, 2014.

(51) Int. Cl.
| | | |
|---|---|---|
| G08B 17/00 | (2006.01) | |
| G01K 11/18 | (2006.01) | |
| G01K 11/06 | (2006.01) | |
| G01R 31/02 | (2006.01) | |
| H02S 40/34 | (2014.01) | |
| H01H 85/055 | (2006.01) | |
| H01H 85/26 | (2006.01) | |
| H01H 85/42 | (2006.01) | |
| H02H 3/08 | (2006.01) | |
| H01H 71/14 | (2006.01) | |
| H02H 3/04 | (2006.01) | |

(52) U.S. Cl.
CPC ............. *G01K 11/18* (2013.01); *G01K 11/06* (2013.01); *G01R 31/024* (2013.01); *H01H 71/145* (2013.01); *H01H 85/055* (2013.01); *H01H 85/26* (2013.01); *H01H 85/42* (2013.01); *H02H 3/085* (2013.01); *H02S 40/34* (2014.12); *H01H 2205/002* (2013.01); *H02H 3/04* (2013.01)

(58) Field of Classification Search
CPC ...... G01K 11/06; G01K 11/18; G01R 31/024; H01H 71/145; H01H 85/055; H01H 85/26; H01H 85/42; H01H 2205/002; H02H 3/085; H02S 40/34
See application file for complete search history.

(56) References Cited

U.S. PATENT DOCUMENTS

| | | | | |
|---|---|---|---|---|
| 4,003,039 | A * | 1/1977 | Dunphy | G08B 17/12 250/554 |
| 5,323,011 | A * | 6/1994 | Suter | G01T 1/06 250/368 |
| 5,413,790 | A * | 5/1995 | Koppe | B29C 61/0608 174/DIG. 8 |

(Continued)

*Primary Examiner* — Quang D Pham

(57) ABSTRACT

A system for protection from fires and electrical shock of components used in construction of electrical systems is disclosed using a sensing degree of characteristic before an arc fault, with the purpose to detect, annunciate, and remove the hazard before an electrical arc occurs.

14 Claims, 2 Drawing Sheets

(56) References Cited

U.S. PATENT DOCUMENTS

| | | | |
|---|---|---|---|
| 6,016,250 A * | 1/2000 | Hanners | H01L 23/34 174/16.3 |
| 6,128,188 A * | 10/2000 | Hanners | H01L 23/34 165/80.3 |
| 6,433,976 B1 * | 8/2002 | Phillips | G01R 31/1218 361/42 |
| 7,005,992 B2 | 2/2006 | Kawai et al. | |
| 7,206,202 B2 * | 4/2007 | Yang | H01L 23/467 165/80.2 |
| 7,366,622 B1 | 4/2008 | Nemir et al. | |
| 8,028,531 B2 * | 10/2011 | Phan | H01L 23/34 62/259.2 |
| 8,459,807 B2 * | 6/2013 | Herbert | G02B 27/2214 359/530 |
| 2002/0181544 A1 * | 12/2002 | Huang | G01K 7/203 374/170 |
| 2005/0265423 A1 * | 12/2005 | Mahowald | G08B 17/125 374/121 |
| 2006/0104869 A1 * | 5/2006 | Chiba | B01J 19/0013 422/129 |
| 2007/0045589 A1 * | 3/2007 | Ittel | B22F 1/0096 252/500 |
| 2007/0169928 A1 * | 7/2007 | Dayan | H01L 23/34 165/287 |
| 2007/0171955 A1 * | 7/2007 | Kanai | G01N 25/68 374/28 |
| 2008/0042857 A1 * | 2/2008 | Gregory | F02C 7/25 340/600 |
| 2008/0049367 A1 * | 2/2008 | Carson | H02H 3/12 361/87 |
| 2010/0277325 A1 * | 11/2010 | Kopelman | G01J 5/58 340/595 |
| 2010/0315752 A1 * | 12/2010 | Rabu | H01R 31/06 361/103 |
| 2011/0037600 A1 * | 2/2011 | Takehara | H01L 31/02021 340/635 |
| 2011/0063768 A1 * | 3/2011 | Sexton | H02H 3/10 361/79 |
| 2011/0181294 A1 * | 7/2011 | Ziegler | G01R 31/04 324/538 |
| 2013/0038055 A1 * | 2/2013 | Ostrom | F01K 25/065 290/2 |
| 2014/0233141 A1 * | 8/2014 | Blemel | H02H 7/20 361/78 |
| 2015/0028117 A1 * | 1/2015 | Jameson | F24D 5/005 237/12 |
| 2015/0349692 A1 * | 12/2015 | Shibata | F25B 27/00 318/479 |
| 2015/0355245 A1 * | 12/2015 | Ordanis | G01R 21/133 702/62 |

* cited by examiner

METHOD, SYSTEM, AND APPARATUS TO PREVENT ARC FAULTS IN ELECTRICAL CONNECTIVITY

CROSS-REFERENCE TO RELATED APPLICATIONS

This application claims the benefit of Applicants' prior provisional application No. 62/071,789, filed on Oct. 3, 2014.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISK APPENDIX

Not Applicable

LIST OF REFERENCED DOCUMENTS

U.S. Patent Documents

| Pat. No. | Issue Date | Inventor |
| --- | --- | --- |
| 8,576,521 | November 2013 | Rodgers et al |
| 4,988,949 | January 1991 | Boenning et al |
| 5,862,030 | January 1999 | Watkins, et al |
| 6,249,230 | June 2001 | Baldwin et al |
| 5,218,307 | June 1993 | Hiller |
| 6,868,357 | March 2005 | Furse, et. al |
| 7,590,496 | September, 2009 | Blemel |
| 7,356,444 | April 2008 | Blemel |
| 7,277,822 | October 2007 | Blemel |
| 7,974,815 | July 2011 | Blemel |
| 7,049,622 | May, 2006 | Weiss |
| 8,410,950 | April, 2013 | Takehara, et al |
| 13/412,480 | March 2011 | Takada and Takehara |

List of Non-Patent Documents

1. M. W. Earley, P. E., et al, "2014 National Electric Code (NEC) Handbook," 2013 National Fire Protective Association, Quincy, Mass., Thirteenth Edition, p. 889-902.
2. J. Johnson, B. Pahl, C. J. Luebke, T. Pier, T. Miller, J. Strauch, S. Kuszmaul and W. Bower, "Photovoltaic DC arc-fault detector testing at Sandia National Laboratories," 19-24 Jun. 2011, Seattle, Wash., 37th IEEE PVSC.
3. J. Johnson, "Arc-fault detection and mitigation in PV systems: Industry progress and future needs," 28 Feb. 2012, Denver, Colo., NREL Module Reliability Workshop.
4. T. Croft, F. Hartwell, W. Summers, "American Electricians Handbook," Sixteenth Edition, 23 July 2013, McGraw Hill Professional—Publisher.
5. B. Yang, K. Armijo, E. Schindelholz, K. G. Blemel, K. D. Blemel, J. Johnson, "Photovoltaic Balance of System Connector Arc Fault Prognostics through Optical Monitoring," February 2015, Sandia Laboratory Technical Report SAND2015-0883 (Not for public release-For Official Use Only).
6. Underwriter Laboratory Photovoltaic (PV) DC Arc-Fault Circuit Protection 1699B http://standardsinfonet-.ul.com/outscope/outscope.asp?fn=1699B.html
7. Vassighi, A., and Sachdev, M., "Thermal Runaway and Thermal Management," Springer US, 2006.
8. D. Wolpert and P. Ampadu, "Managing Temperature Effects in Nanoscale Adaptive Systems", DOI 10.1007/978-1-4614-0748

DEFINITION OF TERMS

Unsafe Condition: Precursor to an unsafe event. Example: snow; ice, bare electrical wire; component operating above a safety rating.

Unsafe Event: Logical result of an unsafe condition, such as an electrical arc fault, electrified metal, or plasma fire.

Pro-Active: An action that is preventive such as diagnosing a precondition to an unsafe condition such as overheating before an electrical arc occurs, providing sufficient time to prevent arcing and fire, human trauma, and electrocution related to an arc fault.

Connectivity: Insulated wiring, bare conduits and associated attachment means used for the purpose of conducting electrical current. Connectivity components are sometimes called connectors, plugs, terminals, receptacles, or junction boxes among other names.

Ohmic Heating: Energy produced by an electrical current flowing through a resistance.

Ohm's Law: Energy=Current*Resistance (E=I*R)

Arc Fault: An electrical event resulting from electrical breakdown of connectivity or insulation that produces an arc plasma.

US National Electric Code: Official document of rules for installation of electrical connectivity.

Plasma, Plasma Discharge or Plasma Fire: Energy and intense heat generated by arc faults.

Thermal Energy: The internal energy present in a system by virtue of its temperature.

Cloud Computing Service: A popular method for sharing awareness and information, cloud computing provides customers communication, and computation capability with low cost. Cloud computing has many specific features including its ultra-large-scale resources that belong to each cloud provider, having individual addresses, being completely distributed, heterogeneous, and totally virtualized. Cloud computing services provide messaging from location to location without need for dedicated networks.

Thermal Runaway: Transistor-transistor logic (TTL), complementary metal-oxide semiconductor (CMOS), gallium arsenide, and other semiconductors exhibit thermal runaway at temperatures generally above 100.degree. C. The thermal rating of the device is set accordingly.

Thermomorphic Change of Translucence: When a translucent substance is heated, the molecules are given more energy and form crystalline structures, which have a different impedance—thus exhibiting reduced translucence.

Morphing Point: When a solid is heated, the particles are given more energy and start to vibrate faster. At a certain temperature, the particles vibrate so much that the ordered structure breaks down. At this temperature, called the morphing temperature, the solid starts transition into liquid.

Melting Point: The temperature at which a solid changes to a liquid. Each solid has a set melting point at normal air pressure. At lower air pressure, such as up a mountain, the melting point lowers.

BACKGROUND OF THE INVENTION

The present invention relates generally to cloud computing services for surveillance that connect to "Internet of Things" devices to protect homes and businesses from fire and burglary. Such cloud computing services utilize a combination of wired or wireless devices to communicate to remote technicians with "cloud" computers which can be located anywhere. The present invention relates to electrical systems that typically include an infrastructure comprised of mechanical framework, electrical connectivity, and means for disconnecting, regulating, controlling, distributing, and modifying the electricity. Conductors as used herein are conduits. Connectivity as used herein is a general term that includes attachment means used for the purpose of conducting water, chemicals, Direct Current (DC), Alternating Current (AC), or combinations thereof. The connectivity components are sometimes called connectors, plugs, sockets, terminals, receptacles, or junction boxes, among other names.

Without limitation, the focus of the present application is connectivity of electrical systems producing sufficient voltage to cause human trauma and associated arc faults which can cause fires and death. For example, photovoltaic (PV) systems that produce DC electricity directly from the sun's rays. Residential and commercial PV systems are constructed with PV modules that contain a number of interconnected solar cells. The electrical conductors that carry DC output from the solar cells in a PV module are conventionally connected to metal lugs in a "junction box" located on the back of the PV module. Several PV modules are often linked with connectivity to aggregate the current or voltage in what is commonly called a "PV String". The conductors of individual PV modules are joined by one or more electrical connectors that provide connectivity; usually in a series fashion.

The present application is directed to preventing electrical arc faults in connectors that carry over 80 volts. The fault can be caused, for example only, by a manufacturing defect; overload, ohmic heating due to corrosion, or thermal expansion and contraction at the joints by the thermal dynamics of current on the conductor. Arc-faults in connectivity can occur even when the operating voltages and currents are within normal bounds; such as, but not limited to, improper installation, unsafe design, or small air gaps caused by differences in expansion of the conduit and metal contacts in the connector or a manufacturing defect.

The present application relates to diagnosing characteristics of an unsafe condition in an electrical system connectivity component such as a connector with a badly corroded electrically conductive guide (also known as a ferrule) that, unattended, will become more resistive and will likely result in an electrical arc fault that generates white hot plasma and intense heat resulting in conflagration of nearby materials and structures.

The problem of arc faults in PV systems is so serious that the National Fire Protection Association modified the 2014 National Electric Code (NEC), cited as #1 in the above List of Non-Patent Documents, with requirement 690.11 to prevent death and injuries resulting from electrocution and fires of PV systems. The NEC is a publically-available, non-patent document that, because of relevance to the state of art of electrical systems, is included in its entirety herein.

A presentation about arc faults in PV system connectivity is publicly documented in a presentation by Jay Johnson of Sandia Laboratories, entitled "Arc-fault detection and mitigation in PV systems: Industry progress and future needs," at the 28 Feb. 2012, Denver, Colo., NREL Module Reliability Workshop, cited as #3 in the above List of Non-Patent Documents. Ohmic heating can occur in connectivity junctions, in wiring, junction boxes, combiner boxes, inverter boxes, and protection within the electrical distribution system.

There is another Sandia Laboratory Technical Report authored by B. Yang, K. Armijo, E. Schindelholz, K. G. Blemel, K. D. Blemel, and J. Johnson, entitled, "Photovoltaic Balance of System Connector Arc Fault Prognostics through Optical Monitoring," (SAND2015-0883) that focuses on arc faults in connectors that join the anodes and cathodes conductors of PV systems. At the present time, the report is release, designated Limited Release due to its proprietary nature, and included as #5 in the List of Non-Patent Documents above.

The present application differentiates from devices for protection from unsafe electrical events which include, but are by no means limited to, arc fault detectors, circuit breakers, ground fault interrupters, and arc fault circuit interrupters that operate by detecting electrical surges, light of plasma, radio, and other emissions of an electrical discharge but do nothing to pre-empt an arc. Such protection devices are commonly connected to a relay or other disconnecting device that trips to stop electrical current flow when an arc occurs.

There is a pressing need for an improved means described in detail in the present invention that acts autonomously to detect characteristics that, unattended, increase the risk of arc-faults happening and, additionally, that employs means for purposes of signaling, indicating, or annunciating an unsafe condition in need of attention to homeowners, facility managers, or cloud computing services.

BRIEF SUMMARY OF THE INVENTION

The present application teaches a device installed in or proximal to electrical connectivity to provide protection from unsafe conditions that can result in an electrical arc fault in a PV or other electrical connectivity in a manner that the unsafe condition can be mitigated before an arc fault occurs. The present invention also teaches a local area network or cloud computing service in one-way or two-way communication with one or more devices using a combination of wired and wireless means to provide warning and mitigation of the unsafe condition. (Sending data over powered conductors and ground wires with wireless communication to cloud computing services is widely used in smart homes.)

The present invention operates by utilizing in its construction materials that are affected by heat as means to identify and alert to unsafe conditions that lead to electrical arc faults and plasma fire caused by heat in electrical system connectivity. There are numerous examples in published literature of materials that have a property or characteristic that depends reliably on temperature. For example, a thermistor is a type of electrical resistor whose resistance is dependent on temperature.

Other materials, such as semiconductors, also experience the phenomena. Semiconductor thermal runaway occurs when the heat dissipated by the semiconducting device increases as a function of temperature. In particular, thermal runaway of semiconducting devices can result in the situation when the circuit employing the device ceases normal operation. See #7 in List of Non-Patent Documents.

The present application teaches a protection system with means for detection, notification, and mitigation of unsafe conditions in electrical conductivity that works even when voltages and currents are within normal limits. Further, the protection system taught in this application would meet the NEC Section 690.11 and other NEC requirements by annunciating unsafe conditions in PV system equipment and associated connectivity. The protection system would provide time for mitigation by removing or correcting the unsafe condition before the arc-fault occurs, therefore preventing fire damage and human disasters by alerting the system owner or responsible authorities of need for replacement or reinstatement.

The present application teaches a cloud computing service that informs persons in dwellings with televisions or portable communication devices as well as persons who are responsible for dealing with unsafe conditions in electrical systems and connectivity.

Discussion of Prior Art

In preparing this application, a search of World Intellectual Property Organization (WIPO) member websites found over two hundred issued patents for detecting and protecting after electrical arc faults happen in chafing, overload, and wire short situations. None of these patents deal with methods or a system with means to pre-empt DC arcing hours, days, or even months before the discharge occurs. However, several patents and limitations thereof which are overcome by the present application are presented below.

There is a plethora of publically available documents such as, "American Electricians Handbook" by T. Croft, F. Hartwell, and W. Summers (which is included in its entirety by reference herein, referenced as #4 in the List of Non-Patent Documents), that teach electrical system designs and installations, as well as hazards related thereto.

There are numerous examples of prior art, including patents and publications that present principles, methods, systems, apparatus, and techniques for detecting and mitigating active arc-faults when they occur. Several companies have begun embedding electronics into PV components to detect DC arc-faults when they occur such as fuses to blow due to increase in the amount of electrical current supplied by a generator or power facility. These methods cannot work well when sunlight is the energy source, as is the case with PV modules. This means a solar-source arc continues, due to the sun's rays (either direct or reflected from the moon) unless the module is covered somehow to occlude the sunlight; or the connectivity upstream is disrupted.

The following are instances of prior art that a) use active monitoring of voltage, current, light, radio frequency emissions; and b) use of electrical means to determine that insulation is degrading.

U.S. Pat. No. 8,576,521, issued to Rodgers, et al, teaches a controller-based detection system configured to adaptively learn to distinguish between detected light that is indicative of an arc-fault event and detected light that is not related to an arc-fault event such as light from a lightning bolt or a flashlight. During normal operation of the electrical power system, the adaptively-determined one or more detection algorithms are utilized to identify arc-fault events in the electrical power system. Rodgers, et al. does not teach utilizing measurement of parameter change due to ohmic heating to detect risk of arc fault; or use of energy resultant from ohmic energy to monitor electrical connectivity before an arc-fault happens. The present invention differs because it does not require a controller-based detection system.

U.S. Pat. No. 8,410,950, issued to Takehara, et al., teaches a PV panel monitoring apparatus that includes a monitoring module for measuring parameter values related to PV panel voltage and current output, comparing measured values against minimum and maximum values saved in the monitoring module, and outputting an alarm signal when a measured value is outside a range defined by the minimum and maximum values. Takehara, et al teaches monitoring output voltage and current. Takehara does not teach utilizing ohmic heating to diagnose risk of arcing or kinetic energy as means to disrupt flow of electricity to mitigate an unsafe condition before electrical arcing occurs. The present invention differs as it does not require measurement of voltage or current.

U.S. Pat. Nos. 7,590,496, 7,356,444, 7,277,822, and 7,974,815 to Blemel teach detecting damage due to external stressors to sensitized translucent sheets, strips, or strands of media arranged on the surface or within conduits, to detect damage to the conduit such as caused by incision, solvent, or flame. Blemel does not teach prevention of arc faults in conduits during normal operations as means to detect an unsafe condition before arcing occurs. The present invention differs as it does not require detecting damage.

Advantages Over Prior Art

It is an important advantage over prior art that teaches detecting an electrical arc fault the moment when the electrical plasma discharge occurs by observing the light caused by the arc, or the radio frequency emissions of the arc, or change in current caused by the arc, and then interrupting the current flow with a device such as a relay or fuse. Detecting an arc is inadequate because the materials ignited by the extremely hot plasma continue to burn, even though the current flow ceased or the current is shunted.

This invention is contrary to prior art enabling sufficient time to take appropriate action to disrupt flow of current before arcing sufficient to initiate a fire happens.

The present invention provides a solution to a long-felt need to prevent injury or death due to electrical arc faults which have resulted in deaths and injury since high-efficiency PV systems have been installed.

The present invention also applies to unsafe conditions that happen in connectivity within junction boxes, combiner boxes, inverters, and power distribution conduits, as well as junctions in wiring harnesses.

The present invention omits the need for electronic modules and sensors used to recognize the artifacts of a live electrical arc fault, such as a flash of plasma, radio frequency emissions, current rise, and simultaneous voltage drop. Using the heat generated in a connectivity junction that precedes an arc fault is an unsuggested modification of detecting an arc.

Figure 1:
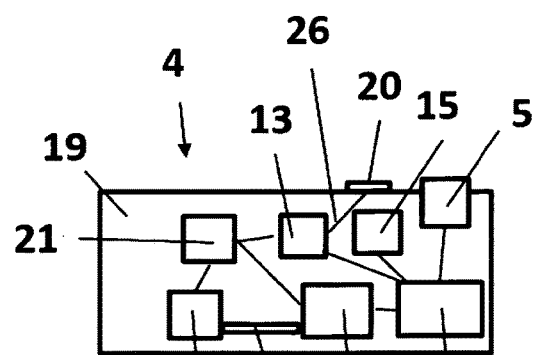
FIG. 1 depicts an unexploded side view diagram of a device with components constructed according to the teaching of this application.
Figure 4:
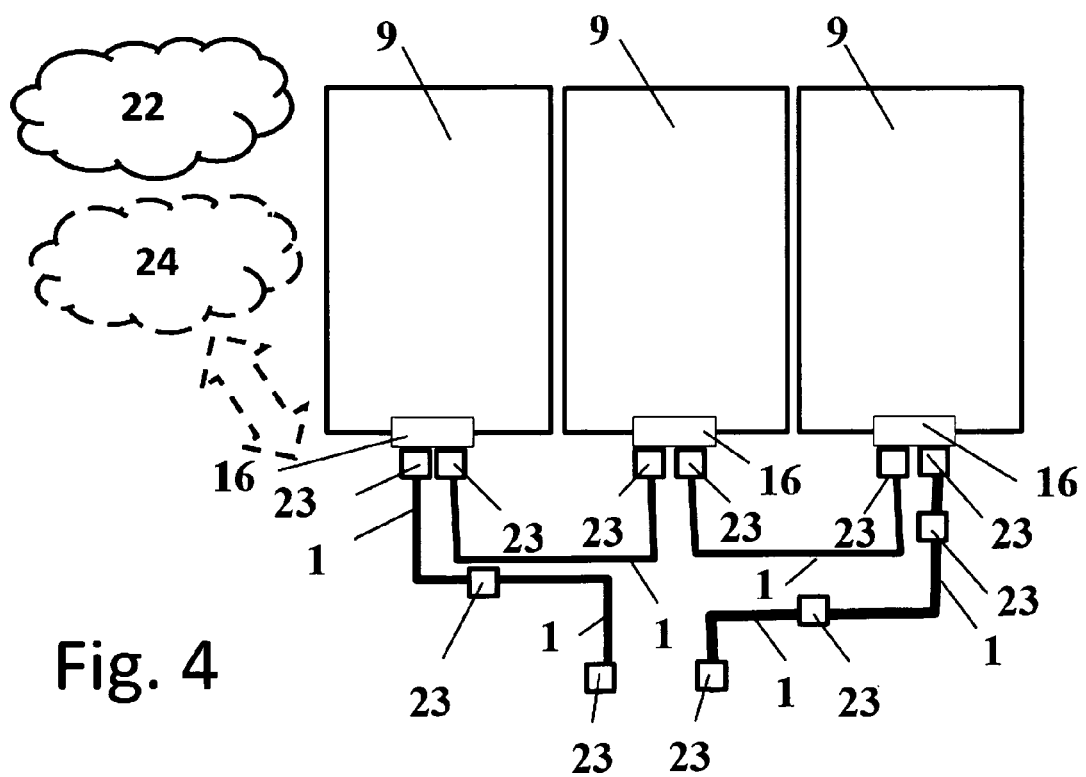

FIG. 4 depicts an unexploded top-view diagram of components of the apparatus shown in FIG. 1 with visible indicator and communication device for a cloud communication device such as a Bluetooth™ or Wi-Fi on the exposed surface.

REFERENCE TO NUMERALS USED IN DRAWINGS

The components identified in the figures are:
(1) Conductor
(2) Male Electrical Connector
(3) Female Electrical Connector
(4) Sensor Device
(5) Indicator Device
(6) Electrically Conductive Guide
(7) Conductive Pin
(8) Power Regulator
(9) PV Module
(10) Dielectric
(11) Thermomorphic Substance
(12) Switch
(13) Monitor
(14) Pass-Through Connector
(15) Temperature Measurement Device
(16) Junction Box
(17) Cavity
(18) Channel
(19) Substrate
(20) Antenna
(21) Communication Device
(22) Cloud Computing Service
(23) Instrumented Connector
(24) Local Area Network
(25) Data Encoder
(26) Unsafe Condition Signal

DETAILED DESCRIPTION OF THE SEVERAL VIEWS OF THE DRAWINGS

Various embodiments of the invention are disclosed in the following detailed description and accompanying drawings. Each drawing teaches how to implement the techniques and or components to effect the purposes of this patent.

FIG. 1 is a side view diagram that depicts components of an exemplary sensor device (4) constructed according to the teaching of this application. The dielectric substrate (19) is depicted as supporting a thermomorphic substance (11) and additionally electrical circuit components including a power regulator (8); a switch (12), data encoder (25), antenna (20), communication device (21), monitor (13) that generates an unsafe condition signal (26), temperature measurement device (15), and an indicator device (5). The components, including the thermomorphic substance (11), could be replaced by an application specific integrated circuit (ASIC). The monitor (13) has purposes including, but not limited to, detecting parameter change of the thermomorphic substance (11) due to heat causing latching of the switch (12), which activates the indicator device (5) and generates an unsafe condition signal (26). The source of power could be scavenged, solar, mechanical, inductive, or other.

Figure 2:
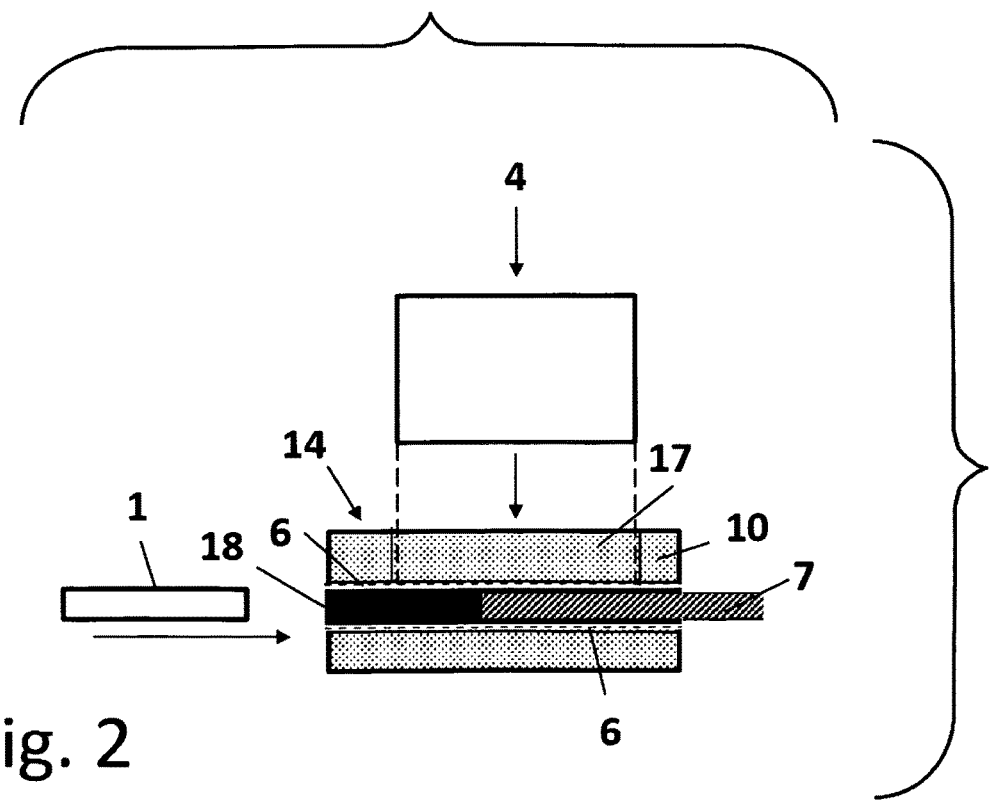
FIG. 2 depicts a frontal, cutaway, exploded view diagram of an electrical connector with an electrical circuit monitoring change of one or more parameters of thermomorphic substance affected by ohmic heating to detect a precondition of an unsafe event, such as DC arcing, in connectivity junctions.

FIG. 2 is a frontal, composite, cutaway, exploded view diagram that describes the functions and components of an apparatus constructed according to the teaching of this application. The upper section is the sensor device (4) described in FIG. 1.

The lower section depicts an exposed end of the conductor (1) sufficient to pass tightly into an electrically conductive guide (6) in the pass-through connector (14). The pass-through connector (14) having an electrically conductive guide (6), that is designed to hold with conductor (1). The sensor device (4) (as shown in FIG. 1) fits into cavity (17) in the pass-through connector (14). The pass-through connector (14) is constructed of dielectric (10). Electrically conductive guide (6) is located in channel (18), which runs axially through the pass-through connector (14). The left portion of the conductive pin (7) is tightly fitted inside the electrically conductive guide (6) an exposed portion sufficient to couple securely with a female connector (not shown). Coupling a male connector (not shown) to the pass-through connector (14) which in turn couples to a female connector (not shown) forms a circuit path when electrical power is present.

In addition to detecting change of parameters within the connectivity, which are a precondition to arcing, the sensor device (4) can additionally provide monitoring of voltage and or current flowing through the connectivity for efficiency, loose connectivity, and other deleterious conditions.

Figure 3:
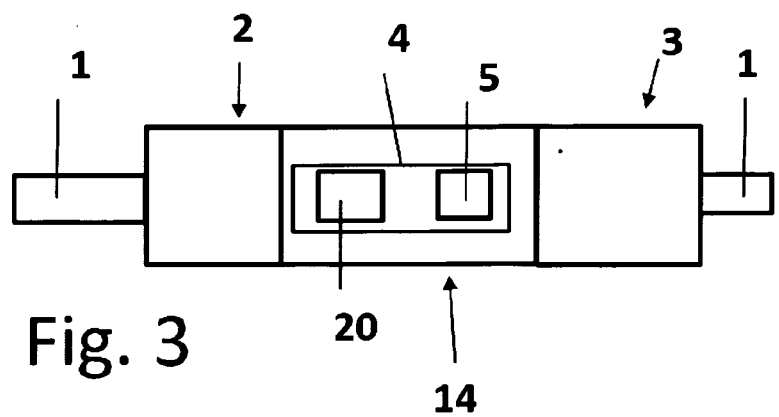
FIG. 3 is a top view, unexploded diagram that depicts components on the upper surface of an assembled apparatus, assembled according to the teaching of this application. The pass-through connector is depicted with a device having an exposed indicator device and a communication device for cloud communication with a protocol such as a Bluetooth™ or Wi-Fi, and an internal cavity filled with a compound that thermally decomposes to provide mitigation and/or protection from an unsafe event.

FIG. 3 is a top view of unexploded diagram that depicts the assembled apparatus according to the teaching of the present application. Conductor (1) passing through the male electrical connector (2) is inserted into the pass-through connector (14). Electrical current conducts via an electrically conductive guide (not shown) within the pass-through connector (14). Conductive pin (not shown) exits the pass-through connector (14) coupling with female electrical connector (3). A conductor (1) exits the female electrical connector (3) to the right. The sensor device (4) has a communication device (not shown) that provides wired or wireless communication using either antenna (20) or encoded signals on the conductor (1) to communicate to compatible devices. Heat generated by ohmic resistance to the electrical current causes heating of male electrical connector (2), female electrical connector (3) and pass-through connector (14). An indicator device (5) indicates the safe/unsafe condition of the connectivity.

FIG. 4 depicts an array of three PV modules (9) transmitting data to a local area network (24) and a cloud computing service (22) from instrumented connectors (23) and junction boxes (16). Insulated electrical conductors (1) are depicted as joined by instrumented connectors (23) taught according to the present application. Sensor devices (not shown) within instrumented connectors (23) perform monitoring for preconditions of unsafe conditions within connectivity of the array of PV modules (9).

Still referring to FIG. 4, communication of unsafe condition data from the instrumented connectors (23), using data on conductors (1) into a junction box (16) is depicted. The data is transmitted by wireless communication circuit in junction box (16) to a local area network (24) or a cloud computing service (22), as appropriate for the situation.

DETAILED DESCRIPTION OF THE INVENTION

The following is a detailed description describing exemplary embodiments to illustrate the principles of the invention. The embodiments are provided to illustrate aspects of the invention, but the invention is not limited to any embodiment. The scope of the invention encompasses numerous alternatives, modifications, and equivalent; it is limited only by the claims.

Numerous specific details are set forth in the figures and descriptions are provided in order to provide a thorough understanding of the invention and how to practice the invention. However, the invention may be practiced according to the claims without some or all of these specific details. For the purpose of clarity, technical material that is known in the technical fields related to the invention has not been described in detail so that the invention is not unnecessarily obscured. A person with ordinary experience in creating connectivity would appreciate that the sensor device could be located in all or any of the pass through connector (14), male electrical connector (2), or the female electrical connector (3). Other variations of embodiment, for example, could utilize a fuse, relay, or other device to open an unsafe connectivity that could be separate from or manufactured integral to the male electrical connector (2) or the female electrical connector (3).

References are cited that provide detailed information about electrical systems, unsafe conditions of electrical systems, and approved techniques for implementing protection systems. However, a person with ordinary experience in instrumenting systems would understand the application applies to steam and chemical piping systems that overheat.

The embodiments of the invention set forth herein relate to detection, notification, mitigation, and isolation of unsafe connectivity that incorporates the present invention for purposes of properly disconnecting the flow of electricity within in the connectivity.

This exemplary embodiment uses change of parameter of a thermomorphic substance at a temperature above the rating of the connectivity as means to cause an unsafe condition signal. There are extensive, publically available scientific papers and technical reports on the subject of thermal mitigated changes. There are many compounds, materials, and substances that change properties and composition due to temperature. A few of many examples of temperature-dependent phenomena are thermal runaway of semiconductors, change of translucence, change of composition, and melting.

Other embodiments of the present invention could additionally include at least one device configured to perform monitoring of temperature within the electrical connectivity. The purpose of the device to confirm exceeding a thermal rating indicative of an unsafe thermal condition and generate an unsafe condition signal. In this augmented embodiment, the electrical circuit is configured to: 1) measure temperature of a connectivity junction; 2) utilize logic to infer an unsafe condition by observing significant change in temperature; and 3) output an unsafe condition signal which causes disconnection of the offending electrical circuit by causing an associated device to open the connectivity.

According to another embodiment of the present invention, a method of detecting an unsafe condition includes analog or digital comparison of voltage and/or current data of measurement of intensity of light from a translucent conductor coupled to a photon detector detecting exceedance of a threshold value, which initiates operation of a current disrupter in order to isolate that portion of the connectivity associated with the unsafe condition. The step of controlling operation of a disrupter device further includes causing the circuit to open and remain open.

According to another embodiment, the device could employ an integrated circuit rated to change state above 85 degrees Celsius complemented by a circuit with 125 degrees Celsius rating for detecting unsafe conditions in connectivity with 85 degrees Celsius. Malfunction of the integrated circuit would indicate an unsafe condition. An 85 degrees Celsius rated integrated circuit (IC) in a monitor circuit will malfunction above its rating and usually recover when the temperature lowers. When the 85 degree Celsius IC is functioning properly, a 125 degree Celsius rated IC monitors the functionality and encodes an unsafe condition signal (safe). From time to time, the 125 degree Celsius rated IC monitor sends the unsafe condition signal to a cloud computing service or by wire or wireless to a computer via a local area network or the condition can be encoded and delivered by wired connection. When overheat causes the 85 degree Celsius rated IC to malfunction (thermal runaway), the 125 degree Celsius IC encodes the unsafe condition signal as true, which alerts of a hazardous condition at that location.

According to still yet another embodiment of the present invention, the device is able to alert an unsafe condition by operating an indicator lamp on the module with the unsafe condition; lighting a lamp located at a distance; or sending an alert signal over a wired or wireless data link to a control station.

In a broad embodiment, the present invention extends to use in other equipment, which is subject to risk of damage, fire, and loss of property due to aging and manufacturing defects.

For example, in the case of manufacturing a connector for use in establishing connectivity, the device could be constructed in connectivity components meeting the appropriate regulatory requirements.

In another example, in the case of manufacturing a PV system component, such as, but not limited to a DC to AC inverter, the embodiment would be situated in connectivity proximal to components and wiring therein that could have an unsafe condition. The device would generate an unsafe condition signal to cause interruption of current flow by opening a circuit or short-circuiting power as appropriate to mitigate the unsafe condition.

Best Embodiment

In a best embodiment, the apparatus is constructed with thermomorphic material or substance selected for properties that will optimize detection of unsafe conditions, and signal for correction and/or mitigation such as but not limited to, communicating to a local area network or a cloud computing service that provides facility monitoring; or causing a switch, relay, or circuit breaker to open the circuit. In a best embodiment, the device produces a repeated or continuous unsafe condition signal at a temperature below the temperature that causes an arc to happen. The reason being, if the warning is ignored, continued increase in corrosion will result progressively and will eventually result in a high temperature arc that would cause conflagration of the insulating material, with collateral fire. A raging fire could cause significant damage and risk of human injury.

In a best embodiment, the device repeatedly sends an unsafe condition signal when a first threshold is exceeded lower than a temperature that indicates imminent arc formation.

In a best embodiment, pre-detection of an emerging unsafe condition with a device would be continuous when electrical current is carried by the conductivity. This approach would also detect heating due to an arc or external fire. Should such conditions occur, the device would send an unsafe condition signal, which results in an alarm and the associate connectivity system component being de-energized by disconnecting the flow of electricity according to the teaching herein.

Construction of Embodiments

The US National Electric Code (2014 Edition) requires that components and conduits used in solar systems must operate at temperatures up to 85 degrees Celsius. The degree of heat generated by flow of electricity in connectivity is represented by Ohm's Law. The relationship means that either increased resistance of the connectivity, such as caused by corrosion, or increased current, such as caused by increasing the number of PV modules, could eventually result in a DC arc with the hazards that the DC arc entails. A temperature of around 200 degrees Celsius is identified as sufficient for sustained arcing in PV connectors and is documented by B. Yang, et al, in reference #5 in the List of Non-Patent Documents, which is incorporated in its entirety by reference.

An instrumented device can be produced by placing a portion of translucent thermomorphic substance that changes optical transmissivity above 85 degrees Celsius which is the rated temperature for PV connectivity. The substance, such as, but not limited to High Density Polyethylene (HDPE), is positioned in close proximity to the components that exhibit resistive electrical heating phenomena, also known as ohmic heating, in a junction of electrical connectivity of an electrical system and can result in localized elevated heating loosening bonds or dielectric insulation breakdown that results in arcing.

In order to produce a device according to the teaching of this patent, select from substances that produce a measurable change in parameter above the maximum specified operating temperature but sufficiently below the temperature where debonding or dielectric breakdown resulting in arcing is expected to occur. For example, if the maximum operating temperature of a connectivity component is 80 degrees Celsius, according to the American Society of Test and Measurement Engineers (ASTME), translucence of HDPE decreases above 104 degrees Celsius; a point the ASTME calls, "T.sub.m". Further, HDPE melts at 150 degrees Celsius, a point the ASTME calls, "Ta". Alternatively, the substance, for example, could be a semiconductor material which becomes a conductor (or non-conductor) above a certain temperature based on its composition.

Embodiments, without limitation, can be constructed without an electronic circuit, or with a digital circuit, or an analog circuit, or a combination. The device should, according to need to communicate, be able to send and receive analog and digital input signals. The circuitry should be designed with the ability to be unaffected by the electrical current on the conductors.

Other embodiments of the design could, according to need to take pre-action, also have analog and/or digital outputs to provide actuation such as, but not limited to a status indicator light or semaphore, or a means for sending data and information such as, but not limited to, coded modulation onto the electrical current carried by the conductor within the connectivity; or wireless means, for sending information using approved protocols such as, but not limited to, Bluetooth™ or Ethernet.

If the thermomorphic substance is a semiconductor, the substance should be selected to change output above the thermal rating of the component and well below the temperature associated with an arc fault.

If the thermomorphic substance is translucent, the photon source to detect change in translucence can be, for example without limitation, a light emitting diode (LED). The photon source should be selected so as to produce wavelengths that are compatible with an associated photon measurement device. The photon intensity measurement device can be selected from, but is not limited to, a photodiode, phototransistor, or photo resistor, which receives photons and produces a measurable voltage or current output. The photon measurement means should be selected for ability to reliably generate an output signal for the limited amount of the frequency of light that will be conducted by the translucent material. The photon detector device should be appropriately biased, if necessary, to operate in the full range of expected illumination. There are a plethora of commercially available devices that serve the purpose. Reliability, stability, and durability are key parameters to be considered in making a selection.

The thermomorphic substance for constructing the device can be, for example and without limitation, loops, strips, pieces, or strands of any length, axial, and longitudinal dimension. The thermomorphic substance can be selected of polymers such as, but not limited to, polyethylene, that produce measurable change in transmissivity spanning temperatures sufficiently below the temperature where an electrical arc forms yet above the maximum temperature rating of the connectivity component, which is monitored. The thermomorphic substance should be selected for having appropriate characteristics such as, but not limited to, thickness, melting point, change in transmissivity, toxicity of any byproducts when heated, and tensile strength. If coated, the coating should be appropriate for the application. If a translucent thermomorphic substance is used, it should not substantially discolor or occlude light over time for so long as the operational life of a system component wherein the sensor is installed. Another property affecting selection could be how the thermomorphic substance conducts or does not conduct light when affected by temperature.

Means for determining an unsafe condition includes, but is not limited to, using an electronic circuit rated above the rating of the components to measure temperature indirectly. For example, indirect means could be accomplished by measuring change in a voltage parameter affected by temperature.

The energy source for a circuit incorporated into the device design, could be, but is not limited to, a tap of energy carried by the conductor, an inductive coil surrounding the conductor, or a solar cell. The energy source, if any, should be selected for operating as long as possible and to hold sufficient charge for as long as the system component wherein the sensor is installed.

Digital or analog information, including but not limited to, unsafe condition signals, temperature measurements, and alerts produced by the device, can be delivered to a remote transceiver located in a junction box or a combiner box, that relays the information to an electrical system health monitoring and control center. The information could be used, for example, to produce an estimate of risk for future time intervals that an arc will likely occur by using an algorithm based on parameters including, but not limited to, the rate of increase in temperature sensed and time. The means to deliver the information could be wireless using a protocol such as but not limited to Bluetooth or Wi-Fi (such as, for example only, a modulation on the conduit DC or AC signal).

The device should operate to produce an unsafe condition signal when a temperature trigger below the temperature associated with a sustained arc is produced due to temperatures within electrified connectivity. (B. Yang, et al, cited previously as #5 in the List of Non-Patent Documents above, found the temperature sufficient to sustain a DC arc is 200 degrees Celsius.)

In accordance with yet another aspect of the present invention, the material used to produce the packaging should be reliable and stable for the expected service life of the connectivity.

In accordance with a third aspect of the present invention, the apparatus could include features such as, but not limited to, a self-test function, ability to annunciate, to be interrogated by wired or wireless means, and interrupt current flow by opening the circuit to stop the flow of electricity.

To test the functionality of the system, create an apparatus for performing a series of measurement tests that produce data to determine the response characteristics of the thermomorphic substance at a range of temperatures. Testing in an instrumented thermal test chamber is one means. Increasing the resistance can be accomplished by placing the corrodible test article in a salt-air environment at an elevated temperature to quicken the corrosion and thus the resistance.

In yet another test configuration, additionally include a comparator logic means (such as a differential amplifier) settable at a preferred temperature with the purpose to generate an unsafe condition signal such as illumination of a warning light, release of a semaphore, or transmission of a wireless or wired signal. The unsafe condition criteria could include, but is not limited to, one or more of a threshold value, a range of threshold values, or a predetermined signature.

In accordance with another aspect of the present invention, if the comparator logic requires electricity to operate, it is connected to electricity carried by the connectivity or electricity from another source, such as a battery or capacitor energized by kinetic energy or solar energy.

Reduction to Practice

In April 2014, under an appropriate non-disclosure agreement, Sandia National Laboratories (SNL) was commissioned to explore the temperature at which a DC arc initiates in a single conductor connector of the type used in PV connectivity. This SNL research resulted in Sandia Laboratory Technical Report SAND2015-0883, February 2015, (Not for public release—For Official Use Only), which determined that a first arc in a PV connector occurs in PV connectors at around 200 degrees Celsius. In this research, SNL also explored whether melting of translucent thermomorphic substances could be applied successfully to detect arc-faults in PV connectors. The concept being that in the event of hot spots, which are known to precede arc-faults, a proximal translucent polymer strand operationally coupled to a photon detector and a light emitter would melt and the light signal from the light emitter would diminish or cease to reach the photon detector, causing a logic circuit to signal a pre-arc condition. An alternative is an illuminated proximal translucent polymer strand coupled to a photon detector would exhibit reduced transmissivity and the reduced light signal reaching the photon detector would cause a logic circuit to signal an interrupter device to open the connectivity and stop the flow of current.

We, the inventors, explored using the phenomena of thermal response to develop a method based on temperature affects that could be applied to predict and prevent an arc-fault in connectivity above 100 degrees Celsius and below the 200 degrees Celsius at which SNL research found that a DC arc initiates. The concept being that in the event of increased resistive heating caused by conductor corrosion within a connector, the temperature within the connector body would measurably change and reflect degree of risk. When the amount of change increases significantly, a signal would be produced to an integral interrupter means to disconnect the connector and stop the flow of current.

We, the inventors, explored thermal effects on translucent polymers at temperatures under 200 degrees Celsius. We, the inventors, found several translucent polymers, according to the ASTME, that exhibit the property to melt at a temperature below 200 degrees Celsius. The inventors experimented with polymers including low density polyethylene (LDPE) which melts at 125 degrees Celsius and high density polyethylene (HDPE) which, according to the ASTME, melted at 150 degrees Celsius.

We, the inventors, also explored utilizing semiconductor circuits which are known to become unstable above 125 degrees Celsius based on its composition as temperature affects the energy band gap. (This property is documented by D. Wolpert and P. Ampadu, "Managing Temperature Effects in Nanoscale Adaptive Systems", DOI 10.1007/978-1-4614-0748, cited as #8 in the List of Non-Patent Documents.)

We, the inventors, modified commercial, injection-molded, PV connectivity connectors to incorporate an integrated circuit with thermal rating of 85 degrees Celsius coupled to a circuit rated at 100 degrees Celsius. Examples of corroded PV connectivity electrically conductive guides and pins were created to produce exemplary heating caused by corrosion at electrical current typical of that of PV connectivity at the present time. The test example was assembled. The test example worked as described herein establishing that resistive heating within a connector well below the 200 degree Celsius that produces an arc can be accomplished.

Another prototype device was constructed consisting of an LED positioned on a thumbnail-size circuit board to illuminate a strip of translucent Low Density Polyethylene (LDPE) and a photon detector positioned at the opposing end of the LDPE received the photons emitted by the LED. The output of the photon detector was connected to a comparator logic circuit biased to produce an output signal when the voltage from the photo detector exceeds a threshold value. LDPE was chosen for the property of decreasing transmissivity above 100 degrees Celsius and melting above 150 degrees Celsius. The device was calibrated by adjusting the bias of comparator circuit so as to produce an output signal at the voltage generated by the photo detector at its rating of 125 degrees Celsius. When power was applied, the photons from the LED were transported through the strip of LDPE to the photo detector which produced a measureable signal proportional to the loss of transmissivity of the LDPE. The device was tested in a thermostatically controlled oven.

CONCLUSIONS, RAMIFICATIONS, AND SCOPE

The present invention has been described in terms of the preferred embodiment, and it is recognized that equivalents, alternatives, and modifications (aside from those expressly stated), are possible and within the scope of the appending claims.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. A person with ordinary experience in creating electrical connectivity would appreciate that the sensor device could be located in the wiring as well as all or any of the pass-through connector (4), male electrical connector (2), or the female electrical connector (3) in the figures.

A person with ordinary experience would appreciate that the connectivity can be within a junction box, a panel, or electronic assembly. The invention should therefore not be limited by the above described embodiment, method, and examples, but by all embodiments and methods within the scope and spirit of the invention.

The previous description of specific embodiments is provided to enable any person skilled in the art to make or use the present invention. The various modifications to these embodiments will be readily apparent to those skilled in the art, and the generic principles defined herein may be applied to other embodiments without the use of the inventive faculty.

What is claimed is:

1. An apparatus for providing protection from an unsafe thermal condition of an electrical connectivity, that precurse unsafe events, with a maximum temperature rating, the apparatus comprising:
    a monitor, disposed within or on the electrical connectivity, configured to detect a change of parameters of a translucent thermomorphic substance due to heat of the electrical connectivity causing latching of a logic, the monitor comprising:
    the translucent thermomorphic substance selected from thermomorphic substances having one or more dimensions that change at a temperature above the maximum temperature rating of the electrical connectivity; the translucent thermomorphic substance having a first end, a second end, and a transmissivity parameter;
    a photon source operably coupled to the first end; and
    a photon measurement device operably coupled to the second end to measure an intensity of photons;
    wherein a change in the intensity of photons indicates a change in the one or more dimensions of the translucent thermomorphic substance at the temperature above the maximum temperature rating of the electrical connectivity causing the latching of the logic, and
    the monitor generates an unsafe thermal condition signal in response to the latching of the logic to indicate the unsafe thermal condition of the electrical connectivity.

2. The apparatus of claim 1, wherein the unsafe thermal condition is related to exceeding the temperature rating of an electrical connector of the electrical connectivity.

3. The apparatus of claim 1, wherein the unsafe thermal condition of the electrical connectivity is related to a precondition in an electrical arc.

4. The apparatus of claim 1, wherein the unsafe thermal condition of the electrical connectivity is consequent to ohmic heating.

5. The apparatus of claim 1, further comprising at least one indicator device configured to provide a visible indication of the unsafe thermal condition of the electrical connectivity.

6. The apparatus of claim 1, further comprising a communication device configured to provide wired or wireless communication to compatible devices in response to the unsafe thermal condition of the electrical connectivity.

7. A method for mitigation of an unsafe thermal condition in an electrical connectivity with a safety related temperature rating, that precurse unsafe events, the method comprising the steps of:
    placing at least one monitor in or proximal to the electrical connectivity; the monitor being configured to detect a change of parameters of a translucent thermomorphic substance due to heat of the electrical connectivity causing latching of a logic;
    monitoring, by said at least one monitor, a change in an intensity of photons of the translucent thermomorphic substance having a morphing point below 200 degrees Celsius yet above the safety related temperature rating of the electrical connectivity; wherein the translucent thermomorphic substance selected from thermomorphic substances having one or more dimensions that change at a temperature above the safety related temperature rating of the electrical connectivity, the translucent thermomorphic substance having a first end, a second end, and a transmissivity parameter; a photon source being operably coupled to the first end; and a photon measurement device being operably coupled to the second end to measure the intensity of photons; wherein the change in the intensity of photons indicates a change in the one or more dimensions of the translucent thermomorphic substance at the temperature above the safety related temperature rating of the electrical connectivity causing the latching of the logic, and
    in response to detecting the latching of the logic, said at least one monitor generates an unsafe thermal condition signal indicative of the electrical connectivity operating at a temperature above the safety related temperature rating.

8. The method of claim 7, wherein the unsafe thermal condition of the electrical connectivity is related to a precondition to an electrical arc of the electrical connectivity.

9. The method of claim 7, wherein the unsafe thermal condition signal is transmitted to a cloud computing service or a local area network by a wireless means.

10. The method of claim 7, wherein the unsafe thermal condition signal is transmitted via a wire to a computing device.

11. A service for providing a notification of an unsafe thermal condition in an electrical connectivity with a maximum temperature rating, that precurse unsafe events, the service comprising:
    one or more apparatus configured to notify the unsafe thermal condition of the electrical connectivity in response to receiving an unsafe thermal condition signal from one or more monitors installed in, or proximal to, the electrical connectivity; the one or more monitors being configured to detect a change of parameters of a translucent thermomorphic substance due to heat of the electrical connectivity causing latching of a logic; said one or more monitors comprising:
    the translucent thermomorphic substance having a morph point between the maximum temperature rating of the electrical connectivity and 200 degrees Celsius; wherein the translucent thermomorphic substance selected from thermomorphic substances having one or more dimensions that change at a temperature above the maximum temperature rating of the electrical connectivity, the translucent thermomorphic substance having a first end, a second end, and a transmissivity parameter; a photon source being operably coupled to the first end; and a photon measurement device being operably coupled to the second end to measure an intensity of photons; wherein the change in the intensity of photons indicates a change in the one or more dimensions of the translucent thermomorphic substance at the temperature above the maximum temperature rating of the electrical connectivity causing the latching of the logic, and said one or more monitors configured to communicate to said service the unsafe thermal condition signal in response to the latching of the logic.

12. The service of claim 11, wherein the unsafe thermal condition is a precondition to an electrical arc of the electrical connectivity.

13. The service of claim 11, wherein the notification comprises a request for mitigation of the unsafe electrical connectivity.

14. The service of claim 11, wherein the said one or more monitors estimate a risk of an electrical arc in one or more future time intervals.

* * * * *